United States Patent [19]

Wright

[11] Patent Number: 4,922,129
[45] Date of Patent: May 1, 1990

[54] FEED FORWARD DARLINGTON CIRCUIT WITH REDUCED NPN REVERSE BETA SENSITIVITY

[75] Inventor: Michael E. Wright, Berkeley, Calif.

[73] Assignee: National Semiconductor Corporation, Santa Clara, Calif.

[21] Appl. No.: 302,502

[22] Filed: Jan. 26, 1989

[51] Int. Cl.[5] ............................................ H03K 19/088
[52] U.S. Cl. .................................... 307/315; 307/300; 307/549; 307/255
[58] Field of Search ............... 307/315, 300, 549, 562, 307/296.4, 255, 299.1, 299.3

[56] References Cited

U.S. PATENT DOCUMENTS 4,705,986 11/1987 Taki ...................................... 307/300
4,725,741 12/1988 Shekbawat et al. ................ 307/315

OTHER PUBLICATIONS

10 Amp/80 Volt Power Darlington, 11–68, p. 1.

Primary Examiner—Stanley D. Miller
Assistant Examiner—Terry Cunningham
Attorney, Agent, or Firm—Gail W. Woodward; Lee Patch; Michael A. Glenn

[57] ABSTRACT

A Darlington output stage is shown in which the saturation voltage is reduced to the level of a single common emitter output transistor. The circuit includes a lateral feed-forward transistor that bridges the driver transistor. A resistor is included to ensure that the driver transistor is turned off when the output transistor saturates. An IC version of the circuit is set forth in detail.

3 Claims, 2 Drawing Sheets

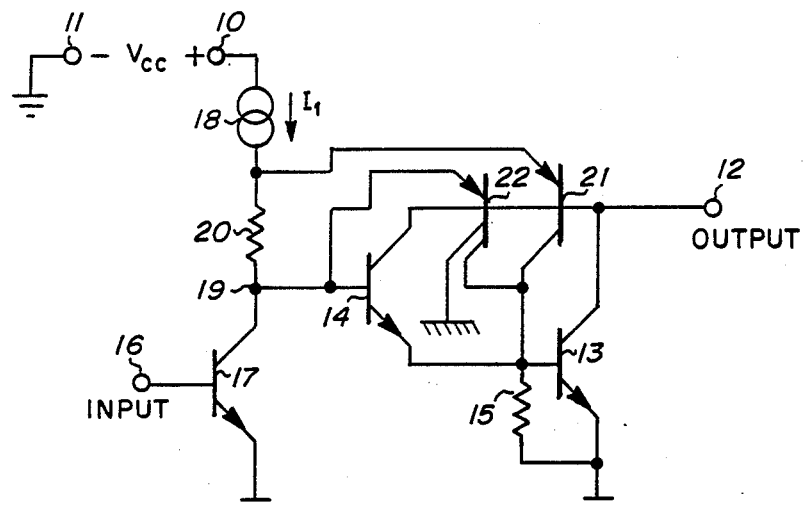
*Fig_1*
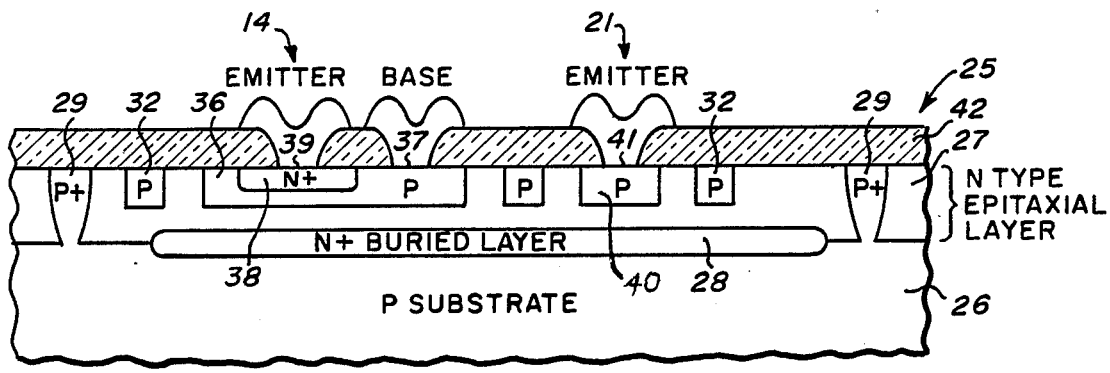
*Fig_3*

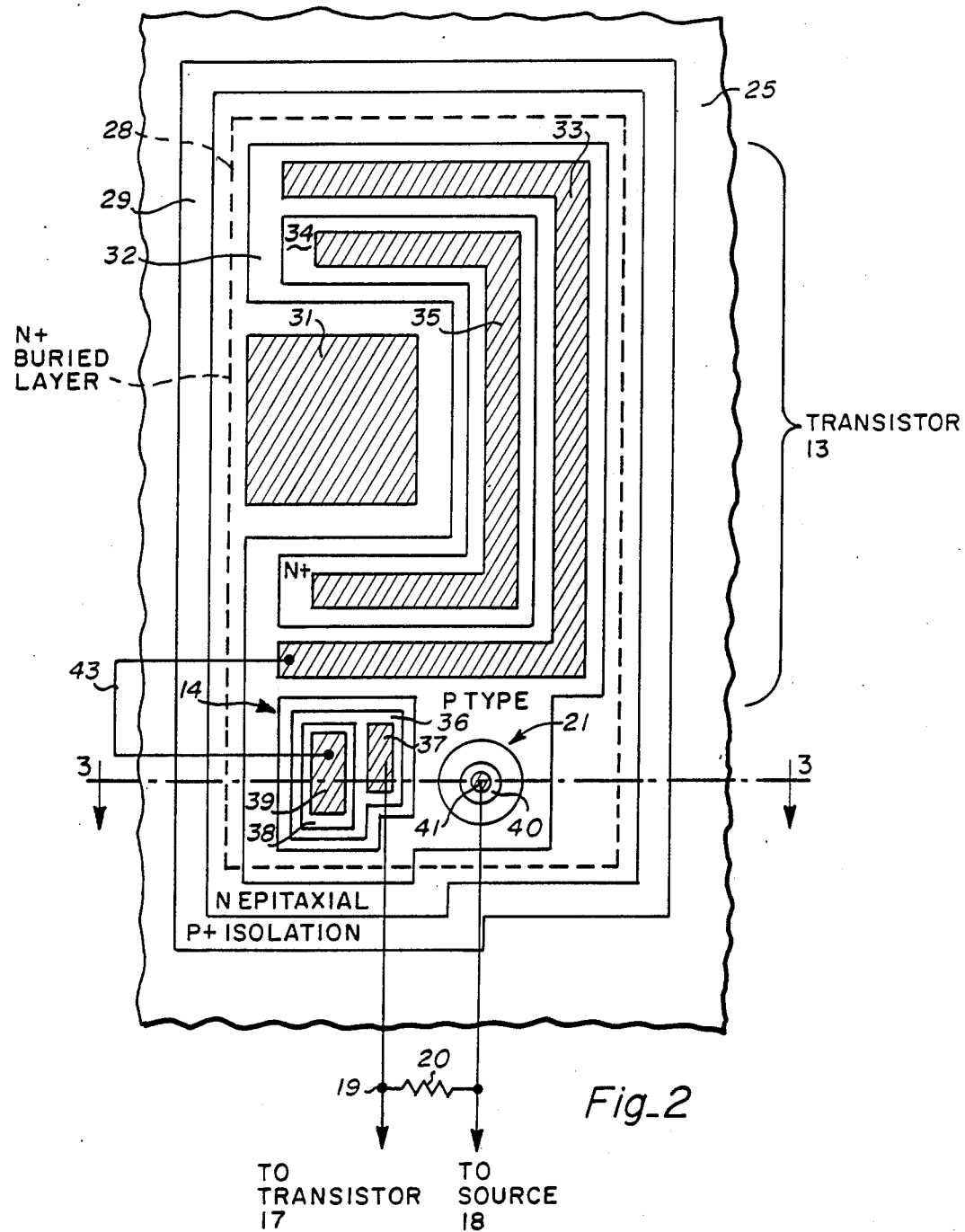
Fig_2

FEED FORWARD DARLINGTON CIRCUIT WITH REDUCED NPN REVERSE BETA SENSITIVITY

BACKGROUND OF THE INVENTION

In the well-known Darlington-connected transistor pair a driver transistor has its emitter connected to the base of an output transistor and the collectors are commonly connected. Since the driver acts as an emitter follower to drive the output transistor as a common emitter element, a very high current gain is achieved. This applies to both the NPN and PNP transistor versions that are popular in discrete and integrated-circuit (IC) forms. However, the Darlington pair has an undesirably high saturation voltage. When turned on the saturation state produces a voltage drop of $V_{BE}+V_{SAT}$ which is approximately one volt at 300' K. This is high relative to the fractional volt saturation ($V_{SAT}$) of a single common emitter transistor.

One way to overcome the problem is set forth in U.S. Pat. No. 4,542,389, which issued to Dennis M. Monticelli on Sept. 17, 1985. This patent is titled FEED FORWARD DARLINGTON CIRCUIT and is assigned to the assignee of the present invention. The Monticelli invention involves the inclusion of a complementary transistor in the Darlington-connected pair which acts to drive the output transistor into saturation when turned on. Thus, the pair will produce a saturation output equal to that of a single transistor. This action requires that the Darlington driver transistor have a low beta in the inverted state and this may require a specially constructed driver transistor. The teaching in U.S. Pat. No. 4,542,399 is incorporated herein by reference.

SUMMARY OF THE INVENTION

It is an object of the invention to create a feedforward Darlington circuit in which the output transistor can be driven into saturation and which does not require an input transistor having low inverted beta characteristics.

It is a further object of the invention to employ a complementary feed forward transistor in combination with a Darlington transistor pair and a bias resistor to provide a low output saturation voltage.

These and other objects are achieved in a Darlington circuit configuration as follows. A complementary transistor is combined with the Darlington circuit with the complementary transistor base associated with the combined Darlington collectors. The collector is coupled to the output transistor base and the emitter is returned to the driver transistor base by way of a resistor. This resistor provides the return of the driver transistor base to the input current supply. A second complementary transistor, which also has its base associated with the Darlington collector, has its emitter returned directly to the driver transistor base. Its collector returns the emitter current to either or both of the output transistor base or the semiconductor substrate. When saturation is desired, and the base of the driver transistor is allowed to float, the input current supply will turn on the complementary transistors which will thereby act to pull the output transistor base high so as to saturate it as a common emitter device. The second complementary transistor produces a current flow in the resistor. The voltage drop across the resistor that develops due to current flow acts to greatly reduce any driver transistor current flow thereby making its inverse Beta of little if any consequence. Accordingly, no special layout or geometry is needed in the circuit design.

BRIEF DESCRIPTION OF THE DRAWING

FIG. 1 is a schematic diagram of the circuit of the invention.

FIG. 2 is a topograph showing a silicon chip containing the circuit of the invention.

FIG. 3 is a cross-section of the FIG. 2 showing taken at line 3—3.

DESCRIPTION OF THE INVENTION

With reference to FIG. 1 the circuit operates from a $V_{CC}$ power supply connected + to terminal 10 and — to ground terminal 11. Output terminal 12 constitutes the Darlington collector. Output transistor 13 is connected to driver transistor 14 in the Darlington configuration and resistor 15 returns the emitter of transistor 14 to ground. It is to be understood that resistor 15 is ordinarily of a relatively high value and can often be omitted entirely.

Input terminal 16 is connected to the base of amplifier transistor 17. Current source 18 provides a current $I_1$ that normally flows into node 19 by way of resistor 20. Node 19 comprises the input node to the Darlington-connected pair. As the bias at terminal 16 rises and falls, so as to vary the conduction in transistor 17, the potential at node 19 will rise and fall so as to vary the conduction in the Darlington-connected pair. When transistor 17 is off a significant fraction of $I_1$ will flow into the base of transistor 14 thereby attempting to saturate the Darlington-connected pair. Under the best of conventional Darlington conditions this would ordinarily pull the output terminal down to about one volt at 300' K. However, the presence of transistor 21 changes the saturation condition. A portion of $I_1$ will flow into the emitter of transistor 21 and pull it up. Once the emitter of transistor 21 rises to one $V_{BE}$ above its base it will turn on and it will conduct thereby to supply current to the base of transistor 13. A sufficient current in transistor 21 will drive output transistor 13 into saturation. This in turn will pull the collector and terminal 12 down to a small fraction of a volt which represents the common emitter saturation level. Another portion $I_1$ will flow in resistor 20 because of the presence of transistor 22 which is normally a parasitic PNP transistor that exists adjacent to the base of transistor 14. The collector of transistor 14 forms the base of transistor 22 and the base of transistor 14 comprises an emitter that is active when the base-collector junction of transistor 14 is forward biased. Two collectors are shown with one being related to emitter of transistor 14. The other collector is the semiconductor substrate. The current flowing in resistor 20 will pull the emitter of transistor 22 up sufficiently to produce conduction therein. Thus, the emitter of transistor 22 will be at a lower potential than the emitter of transistor 21 due to the drop across resistor 20. As a result, most of $I_1$ will flow in transistor 21 and into the base of transistor 13 to hold it in saturation. Since the base of transistor 14 is connected to the emitter of transistor 22 it too will at a lower potential than the emitter of transistor 21. Thus, conduction in transistor 14 will be reduced to a negligible level and its reverse Beta will be of no significance. Accordingly, its geometry will be of little or no significance.

FIG. 2 shows a topography that is suitable for practicing the invention using silicon monolithic PN junction isolation IC construction. The metallization and oxide layers have been omitted for clarity. FIG. 3 is a cross-section of the showing in FIG. 2 with representations of the metallization and oxide layers included where relevant.

Chip 25 is a fragment of an IC wafer composed of a P type substrate 26 which has an N type epitaxial layer 27 deposited thereon. The structure includes conventional N+ buried layer 28 which underlies the active transistors. In FIG. 2, layer 28 is shown as a dashed outline. The structure is ringed by a P+ isolation ring 29 which isolates an N type tub electrically in the IC. Hatched region 31 represents an N+ diffused region that will make ohmic contact with the N type epitaxial tub material. Region 31 will ultimately be overcoated with metallization (not shown) to create a bonding pad on the IC so that a wire bond (or other suitable connection) can be made thereto. Thus, region 31 will become the common collector connection for transistors 13 and 14 of FIG. 1 so that it comprises terminal 12.

Region 31 is closely surrounded on three sides by a P type region 32 which has a depth selected for the operation of a vertical NPN transistor base. As can be seen in FIG. 3, region 32 extends only part way through the N type epitaxial layer. Hatched region 33 represents a C-shaped contact region wherein metallization will ultimately make an ohmic connection to P type region 32.

Region 34 constitutes a heavily doped or N+ diffused region confined within the central portion of region 32. This diffusion extends only part way through the depth of region 32 and forms an emitter which can inject minority carriers (electrons) into region 32 which forms a transistor base. Hatched region 35 represents a contact area where metallization (not showb) will make ohmic contact to emitter region 34.

In the lower lefthand corner of region 32 a hole is located and transistor 14 is fabricated therein. Region 36 comprises a P type transistor base diffusion. Hatched region 37 is the contact for region 36 and represents the base connection to transistor 14. Region 38 is an N+ type emitter region extending part way into region 36 to provide an emitter. Hatched region 39 is a contact area for emitter region 38.

Transistor 21 is created inside a hole in the lower righthand portion of region 32, as shown in FIG. 2. A P type diffusion 40 forms a lateral PNP transistor emitter and hatched area 41 forms the contact region thereto. Those portions of region 32 surrounding emitter 40 act as the collector for transistor 21.

As can be seen from FIGS. 2 and 3, PNP transistor 22 is actually a parasitic element associated with NPN transistor 14. Base region 36 is the PNP emitter and one collector is a lateral PNP structure created by the extension of region 32 to surround PNP 22 emitter region 36. The epitaxial tub material (the collector 31) is the intervening N type base region. The other collector is actually the substrate that is present opposite emitter 36. Since the N+ buried layer extends across region 36 the vertical parasitic transistor action is greatly reduced so that the lateral PNP collector dominates.

Since the metallization is not shown in FIG. 2 the element interconnections are shown schematically. Jumper 43 connects the emiter of driver transistor 14 to the base of output transistor 13. Resistor 20 is shown being connected between the base of transistor 14 and the emitter of transistor 21. Resistor 20 can be a conventional diffused structure or it can be a resistive layer structure deposited on top of the IC passivation layer (shown in FIG. 3 as element 42). Resistor 20 is typically on the order of a few kiloOhms when $I_1$ is on the order of 10 $\mu a$, and may increase until bounded by $V_{CC}$.

It will be noted that since buried layer 28 also extends under PNP transistor 21 its action is enhanced while any vertical parasitic transistor action is partly suppressed.

The hole in region 32, with NPN transistor 14 and parasitic PNP transistor 22 inside, may, in some cases, be modified by simply removing the region 32 material of the lower left region of 25 in FIG. 2. It is to be noted that the current of transistor 22 may be through either collector since this current is small relative to transistor 21 collector current.

It is to be understood that while the preferred embodiment of the invention has transistors 13, 14 and 21 fabricated into a single IC tub, they could, if desired, be fabricated in two or three separate tubs.

The invention has been described in terms of a preferred embodiment. When a person skilled in the art reads the foregoing description, alternatives and equivalents, that are within the spirit and intent of the invention, will be apparent. Accordingly, it is intended that the scope of the invention be limited only by the following claims.

I claim:

1. A Darlington transistor circuit stage having a pair of like conductivity transistors coupled together as output and driver devices with their collectors commonly connected, means coupling the emitter of said driver transistor to the base of said output transistor and means coupling the base of said driver transistor to an input terminal, said circuit comprising:
   a transistor, of complementary construction to that of said driver transistor, having a base coupled to said commonly connected collectors, a collector coupled to said emitter of said driver transistor and an emitter coupled to said base of said driver transistor;
   a resistor providing the means for coupling said emitter of said complementary transistor to said base of said driver transistor; and
   a constant current device connected to the juncture of said emitter of said complementary transistor and said resistor.

2. The stage of claim 1 wherein said output and driver transistors are of NPN construction and said complementary transistor is of PNP construction.

3. The stage of claim 1 wherein said driver transistor includes a parasitic lateral transistor of complementary construction which produces current flow in said resistor under conditions that saturate said output transistor.

* * * * *